(12) United States Patent
Lim

(10) Patent No.: US 6,387,749 B1
(45) Date of Patent: May 14, 2002

(54) METHOD OF MANUFACTURING A CAPACITOR IN A SEMICONDUCTOR DEVICE

(75) Inventor: Chan Lim, Ichon (KR)

(73) Assignee: Hyundai Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/625,364

(22) Filed: Jul. 25, 2000

(30) Foreign Application Priority Data

Jul. 30, 1999 (KR) .......................................... 99-31221

(51) Int. Cl.$^7$ .......................................... H01L 21/8242
(52) U.S. Cl. ..................... 438/240; 438/238; 438/253; 438/381; 438/396; 438/785; 257/306; 257/310
(58) Field of Search ................................ 438/240, 253, 438/210, 238, 381–396, 785; 257/310, 306

(56) References Cited

U.S. PATENT DOCUMENTS

| 4,143,393 A | 3/1979 | DiMaria et al. ............... 357/52 |
| 4,789,645 A | 12/1988 | Calviello et al. ........... 438/167 |
| 5,187,557 A | 2/1993 | Zenke .......................... 257/310 |
| 5,189,503 A | 2/1993 | Suguro et al. ............... 257/310 |
| 5,302,540 A | 4/1994 | Ko et al. ...................... 438/240 |
| 5,449,630 A | 9/1995 | Lur et al. ..................... 438/386 |
| 5,567,964 A | 10/1996 | Kashihara et al. ........... 257/310 |
| 5,677,223 A | 10/1997 | Tseng .......................... 438/253 |
| 5,821,139 A | 10/1998 | Tseng .......................... 438/239 |
| 5,843,820 A | 12/1998 | Lu ............................... 438/243 |
| 5,920,775 A | 7/1999 | Koh .............................. 438/241 |
| 6,150,209 A * | 11/2000 | Sun et al. ..................... 438/240 |
| 6,201,276 B1 * | 3/2001 | Agarwal et al. .............. 27/108 |

* cited by examiner

*Primary Examiner*—Wael Fahmy
*Assistant Examiner*—Hsien-Ming Lee
(74) *Attorney, Agent, or Firm*—Pennie & Edmonds LLP

(57) ABSTRACT

The present invention relates generally to a method of manufacturing a semiconductor device. There is disclosed a method of manufacturing a semiconductor device capable of obtaining a higher static capacity and a lower leak current characteristic. According to the present invention, the method includes forming a lower electrode and forming a tantalum oxide film. In particular, it performs a plasma process during the process of forming the tantalum oxide film, and in the last step of forming the tantalum oxide firm it controls the amount of source fluid to form a tantalum oxy-nitride film, thus forming an upper electrode.

9 Claims, 1 Drawing Sheet

METHOD OF MANUFACTURING A CAPACITOR IN A SEMICONDUCTOR DEVICE

BACKGROUND OF THE INVENTION

1. Field of the Invention

The present invention relates generally to a method of manufacturing a semiconductor device. More particularly, the present invention relates to a method of manufacturing a semiconductor device capable of obtaining a higher static capacity and a lower leak current characteristic, which first forms a tantalum oxide film and then performs a plasma process, and second controls a source to be injected in the last step of forming a tantalum oxide film, thus forming a tantalum oxy-nitride film.

2. Description of the Prior Arts

Recently, tantalum oxide $Ta_2O_5$ becomes used widely as a dielectric film of a capacitor having more than 256M DRAM device. The tantalum oxide film is higher 5 times in the dielectric constant than an ONO film (Oxide-Nitride-Oxide), which is used as a dielectric film of a capacitor in the existing process of manufacturing DRAM. Thus, the tantalum oxide film has become widely used as dielectric film materials of the capacitor in the process of manufacturing DRAM that requires a higher integration. Further, $Ta_2O_5$ can provide a high step coverage if it is processed by CVD process. Also, $Ta_2O_5$ may have a good dielectric characteristic and can be implemented as a less current film, if a subsequent annealing process processes it. Recently, there has been an attempt to reduce the thickness of an effective oxide film of the capacitor to 17 angstrom, in which tantalum oxide is used as the dielectric film using tungsten as a lower electrode.

In this case, the annealing process must be performed under the oxidization atmosphere in order to remove impurities within the tantalum oxide, but it can not performed sufficiently at higher temperature since tungsten forming the lower electrode will be oxidized. Due to this, it is difficult to completely remove the impurity within the tantalum oxide film. Thus, there is a problem that the leak current of the capacitor using the tantalum oxide film as the dielectric film can be increased. Also, there is a high possibility of deteriorating the electrical characteristic of the capacitor since the amorphous tantalum oxide film may react with the titanium nitride film during the process of depositing the titanium nitride film to be an upper electrode by CVD method.

SUMMARY OF THE INVENTION

It is therefore an object of the present invention to provide a method of manufacturing a capacitor in a semiconductor device capable of improving the leak current and the electrical characteristic.

In order to accomplish the above object, the method of manufacturing a capacitor in a semiconductor device according to the present invention is characterized in that it comprises the steps of forming a lower electrode on a semiconductor substrate in which a given lower structure is formed; forming a first tantalum oxide film on the lower electrode and then performing a plasma process to it; forming a second tantalum oxide film and then forming a tantalum oxy-nitride film; and forming an upper electrode on the tantalum oxy-nitride film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
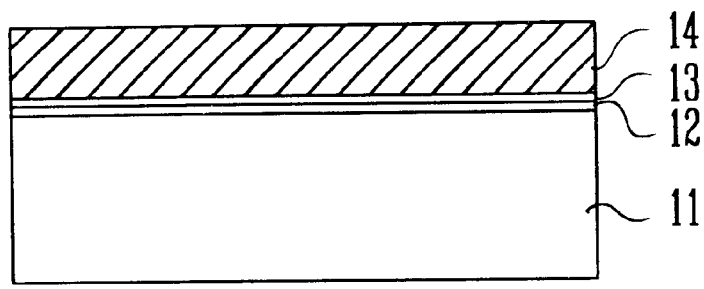
FIGS. 1A through 1C are sectional views for illustrating a method of manufacturing a capacitor in a semiconductor device according to the present invention.

The present invention will be described in detail by way of a preferred embodiment with reference to accompanying drawings, in which like reference numerals are used to identify the same or similar parts.

Figure 1B:
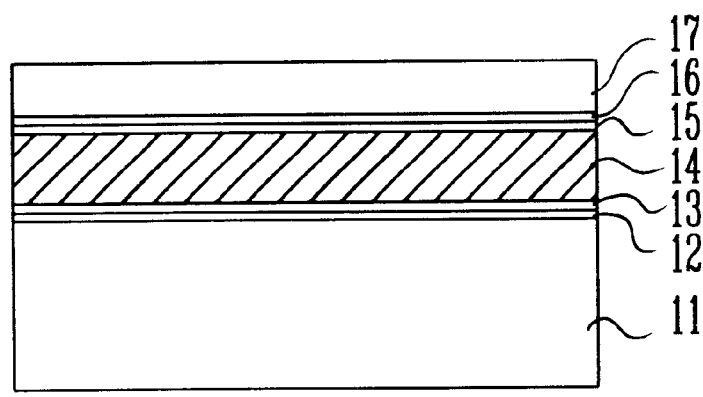
Figure 1C:
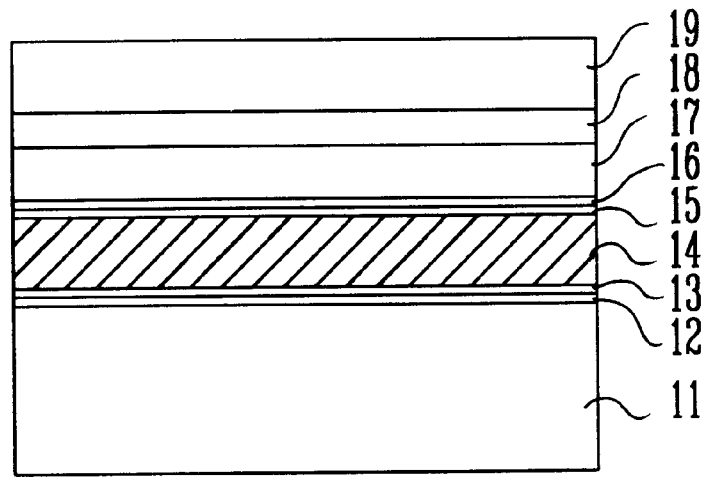

FIGS. 1A through 1C are section views for illustrating a method of manufacturing a capacitor in a semiconductor device according to the present invention.

Referring now to FIG. 1A, a titanium (Ti) film 12, a first titanium nitride (TiN) film 13 and a tungsten (W) film 14 are sequentially formed on a semiconductor substrate 11 in which the underlying structure is formed by a given process, thus forming a lower electrode. At this time, the lower electrode may include only a titanium nitride film, and instead of tungsten, tungsten nitride (WN), ruthenium (Ru), platinum (Pt), iridium (Ir), ruthenium oxide ($RuO_2$), iridium oxide ($IrO_2$) can be used.

Next, an annealing process is performed to the surface of the tungsten film 14 under hydrogen ($H_2$), nitrogen ($N_2$) or helium (He) atmosphere at the temperature of 600° C. during 30 minutes. Then, after the annealing process of depositing the tungsten film using $WF_6$, there remains fluorine (F) remains within the tungsten film. Thus, the annealing process is performed for removing the fluorine (F) remains and thus for prevent damaging the tantalum oxide film deposited in a subsequent process due to fluorine. At this time, during the annealing process, moisture and oxygen concentration within the atmosphere gas must be prohibited as possible. Otherwise, it may cause lifting phenomena in which the entire tungsten electrode to susceptible to thermal oxidization is oxidized. Also, during the annealing process of the tungsten film, there is grown a native oxide film ($WO_3$) on the surface of the tungsten film. Thus, a cleansing process using HF solution is performed for removing this. If the native oxide film grown on the surface of the tungsten film is not removed, the electrical characteristic of the capacitor will deteriorate. Also, if BOE solution is used to remove the native oxide film, the tungsten film is etched and thus the surface of it will become coarse, thus deteriorating the electrical characteristic of the capacitor.

Referring now to FIG. 1B, a first tantalum oxide film 15 is formed on the tungsten film 14. Then, the first tantalum oxide film 15 is formed 50~100 angstrom in thickness by means of LPCVD method using some of the thickness of the tantalum oxide film to be formed. At this time, the first tantalum oxide film 15 must be deposited at a low temperature of 330~420° C. If the deposition temperature of the tantalum oxide film is high, a $WO_3$ film will be formed on the surface of the underlying tungsten film 14, thus increasing the thickness of the effective oxide film of the capacitor and deteriorating the leak current characteristic of the capacitor. Also, the tantalum oxide film will cause oxygen or $N_2O$ to introduce into the reactive furnace due to tantalum athlete [$Ta(OC_2H_5)_5$] of a vapor state and a reactive gas, and thus it will be deposited at the pressure of 100 mTorr~5 Torr. Then, a $N_2O$ or $O_2$ plasma process is performed to the tantalum oxide film 15 at the temperature of 150~400° C. In case of depositing the tantalum oxide film using LPCVD method, there will be generated carbon or oxygen defects within the film, which will cause a capacitor leak current. Thus, the plasma process is performed for removing the defects within the tantalum oxide film. Also, if the plasma process and the process of depositing the tantalum oxide film are performed in in-situ in the same apparatus, it can prevent deteriorating its characteristic caused by contamination due to exposure of the atmosphere. Then, a second tantalum oxide film 16 is formed as thick as the remaining thickness of the entire tantalum oxide film. At this time, the second tantalum oxide film 16 is deposited by LPCVD method. In the last step of the deposition, it supplies $NH_3$ into the second tantalum oxide film in order to keep constant the total fluid amount, while reducing the amount of the tantalum source supply and oxygen. Then, a tantalum oxy-nitride film 17 is formed on the second tantalum oxide film 16 by means of plasma excitation method. As for the tantalum oxy-nitride film 17, it is difficult to sufficiently perform crystallization of the tantalum oxide film under oxygen atmosphere by a subsequent high-temperature annealing process. Thus, upon the annealing process or the process of depositing the titanium nitride film after formation of the capacitor, the tantalum oxy-nitride film 17 serves as a buffer layer for blocking reaction with the tantalum oxide film and the titanium nitride film to be deposited on it. At this time, the plasma process is performed with the power of 50~200 watt during about 10 seconds~5 minutes.

Next, referring to FIG. 1C, a plasma process is performed to the tantalum nitride films 15 and 16 and the tantalum oxy-nitride film 17. Generally, subsequent processes for removing the defects within the tantalum oxide film may include oxygen or $N_2O$ plasma process and $UV/O_3$ process. In this case, however, it is found that the film quality by the plasma process (or $UV/O_3$ process) can be improved to a given thickness near the surface of the tantalum oxide film. Therefore, it is difficult to improve the film quality to the interior of the tantalum oxide film near its interface. Then, a second titanium nitride film 18 is formed by thermally dissolving $TiCl_4$ gas at the temperature of less than 600° C. and a polysilicon film 19 is then formed, thus forming an upper electrode.

As can be understood from the above description, the present invention can accomplish a higher static capacity and a lower leak current characteristic, by firstly forming a tantalum oxide film and then performing a plasma process, and secondly controlling a source to be injected in the last step of forming a tantalum oxide film, thus forming a tantalum oxy-nitride film.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in a semiconductor device, the capacitor comprising a lower electrode, a first tantalum oxide film on top of the lower electrode, a second tantalum oxide film on top of the first tantalum oxide film, a tungsten oxy-nitride film on top of the second tantalum film and an upper electrode on the tungsten oxynitride film, the method comprising the steps of:

forming a lower electrode on a semiconductor substrate;

forming a first tantalum oxide film on said lower electrode;

performing a plasma process on the first tantalum oxide film;

forming a second tantalum oxide film on the first tantalum oxide film;

forming a tantalum oxy-nitride film on the second tantalum oxide film; and forming an upper electrode on said tantalum oxy-nitride film.

2. The method of manufacturing a capacitor in a semiconductor device according to claim 1, wherein said lower electrode has a structure in which a titanium nitride film and a tungsten film are stacked.

3. The method of manufacturing a capacitor in a semiconductor device according to claim 2, wherein the surface of said tungsten film is subjected to annealing process.

4. The method of manufacturing a capacitor in a semiconductor device according to claim 3, wherein said annealing process is performed under hydrogen, nitrogen or helium atmosphere during 30 minutes.

5. The method of manufacturing a capacitor in a semiconductor device according to claim 1, wherein said lower electrode is a titanium nitride film.

6. The method of manufacturing a capacitor in a semiconductor device according to claim 1, wherein said first tantalum oxide film is formed at a temperature of 330 through 420° C.

7. The method of manufacturing a capacitor in a semiconductor device according to claim 1, wherein said plasma process is a $N_2O$ or $O_2$ plasma process performed at a temperature of 150 through 400° C.

8. The method of manufacturing a capacitor in a semiconductor device according to claim 1, wherein said plasma process is performed in in-situ in the same apparatus as used to deposit said tantalum oxide film.

9. The method of manufacturing a capacitor in a semiconductor device according to claim 1, wherein said tantalum oxy-nitride film is formed in the last step of depositing said second tantalum oxide film, by supplying $NH_3$ into said second tantalum oxide film while reducing the amount of the tantalum source supply and oxygen in order to keep constant the total fluid amount, by means of plasma excitation method.

* * * * *